United States Patent
Ennis et al.

(10) Patent No.: US 6,621,002 B1
(45) Date of Patent: Sep. 16, 2003

(54) CONCEALED BIAXIAL CARD TO FRAME GROUNDING SCHEME

(75) Inventors: Amanda Elisa Ennis, Rochester, MN (US); Greg Steven Lamp, Grand Meadow, MN (US); Ray Clement Laning, Kasson, MN (US); Christopher Michael Marroquin, Rochester, MN (US); Scott Alan Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/092,791

(22) Filed: Mar. 7, 2002

(51) Int. Cl.[7] .................................................. H05K 9/00
(52) U.S. Cl. ................................ 174/35 GC; 174/52.1; 174/138 G; 361/753
(58) Field of Search ............................ 174/52.1, 138 G, 174/35 GC; 361/752, 753

(56) References Cited

U.S. PATENT DOCUMENTS 6,424,538 B1 * 7/2002 Paquin ........................ 361/752

* cited by examiner

Primary Examiner—Hung V. Ngo
(74) Attorney, Agent, or Firm—Rabin & Berdo, PC

(57) ABSTRACT

A ground from a printed circuit board to the frame of an electronic system is formed by a biaxially-compressible conductive spring that is captivated between the printed circuit board and a plastic stiffener to which the board is fastened. The spring makes contact with a ground pad on the underside of the printed circuit board. As the board is fully installed in the electronic system, standoffs attached to the system frame make contact with the conductive spring, completing the ground path. Keyhole-shaped cutouts in the printed circuit board secure the board without the use of tools. When the board assembly is lowered onto the standoffs, the head of the standoff passes through the circular opening of the keyhole. The board assembly is secured in place by sliding it on the standoffs to a position in which the head of the standoff is over the narrower slot portion of the keyhole.

23 Claims, 5 Drawing Sheets

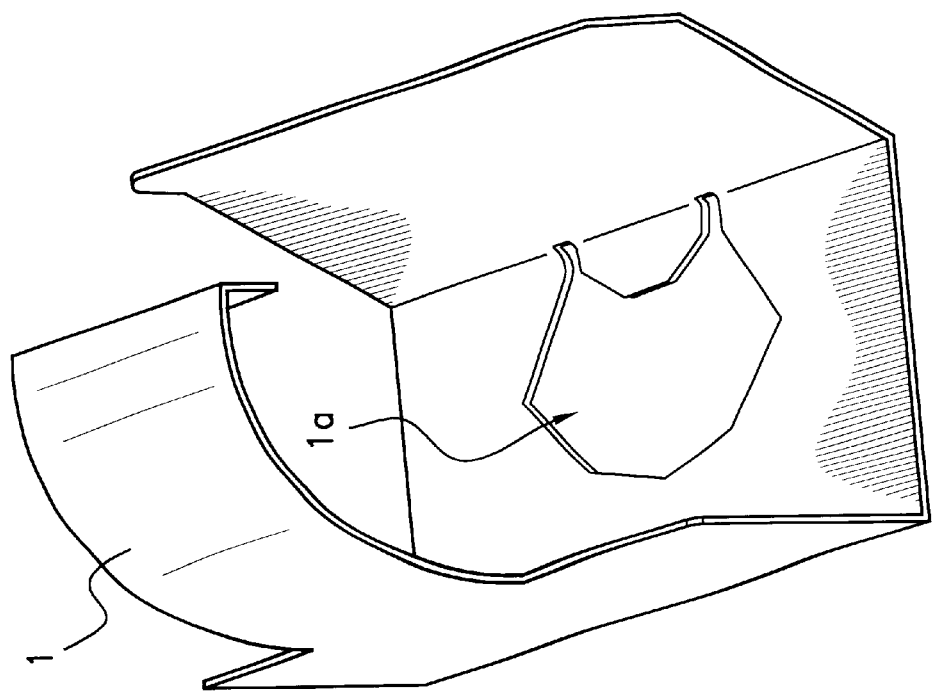

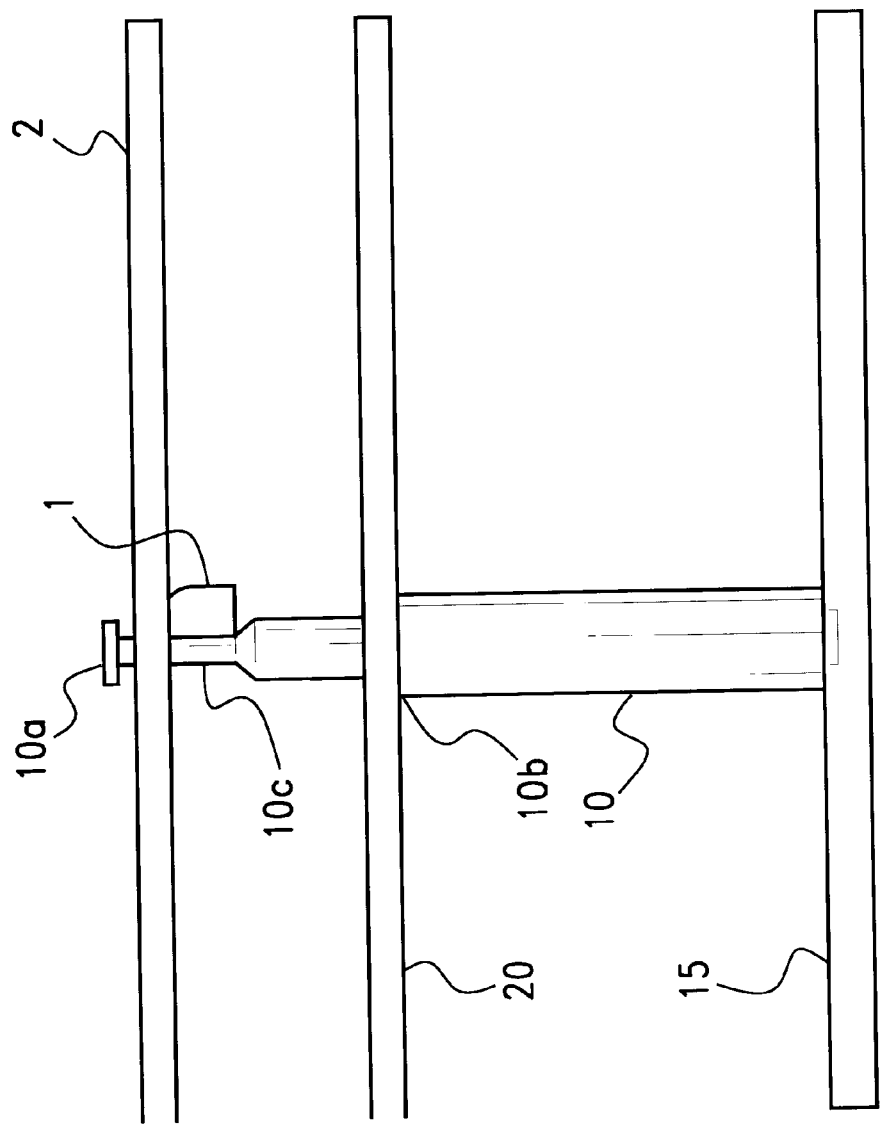

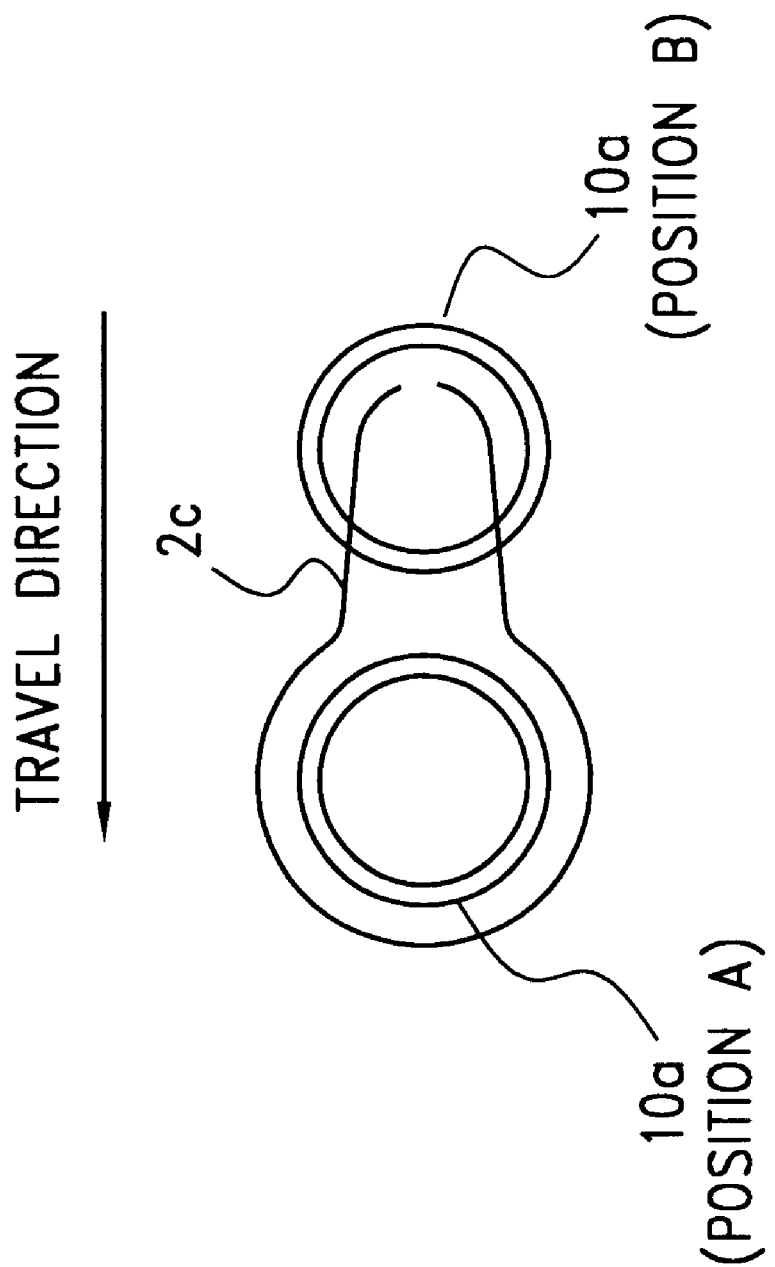

CONCEALED BIAXIAL CARD TO FRAME GROUNDING SCHEME

BACKGROUND OF THE INVENTION

1. Field of the Invention

The invention relates to a scheme for grounding a printed circuit board to a frame of an electronic system, and more particularly to a grounding scheme in which a concealed biaxial spring is used to provide electrical contact between a grounding pad on the printed circuit board and a standoff used to mount the printed circuit board to the frame of the electronic system.

2. Background Information

The integration of printed circuit boards into electronic systems, such as servers, requires that the boards be mechanically fastened and electrically grounded to the system frame, usually accomplished by securing the boards to the frame with screws. These screws provide a ground path from the boards to the frame and electrically carry the ground from the contact pads, which are wired to the ground planes on the boards, to the sheet metal of the frame. However, there are disadvantages to this type of design.

In the above-described arrangement, time is required to install the necessary screws through the board into the system frame. It also requires adequate space to access the screws with a tool. In addition to the screw space constraint, the location of ground pads dictates where the printed circuit board assembly must be mechanically fastened and electrically grounded. In some applications, these desired locations might reside under a part that is secured to the printed circuit board assembly, making it impossible to install the board assembly using screws. Thus, there is a need for a toolless arrangement for fastening and grounding printed circuit boards in such situations. There is further a need of a toolless arrangement that solves the problem of space and access constraints faced by conventional fasteners, such as screws, and also helps reduce board installation time while still providing an adequate grounding scheme.

SUMMARY OF THE INVENTION

It is, therefore, a principle object of this invention to provide a concealed biaxial card to frame grounding scheme.

It is another object of the invention to provide a concealed biaxial card to frame grounding scheme that solves the above-mentioned problems.

These and other objects of the present invention are accomplished by the concealed biaxial card to frame grounding scheme disclosed herein.

In an exemplary aspect of the invention, a board assembly is mounted and secured to a plurality of standoffs attached to the frame of an electronic system. The assembly includes a printed circuit board having a grounding pad formed on one side, and a conductive spring compressible along two axes that makes contact with both the grounding pad and one of the standoffs when the printed circuit board is mounted and secured to the standoffs. The conductive spring completes a ground path from the printed circuit board to the system frame through the one standoff. In the preferred embodiment, the printed circuit board is attached to a plastic stiffener that includes means for retaining the conductive spring in position. Preferably the retaining means is a boss formed on the stiffener and the conductive spring is formed with a hole that fits over the boss, so that no additional hardware is required to retain the conductive spring. The conductive spring has two portions, with the hole being between them. The first portion is adapted to exert a first spring force in a first direction along one axis, and the second portion is adapted to independently exert a second spring force in a second direction along another axis that is essentially perpendicular to the first axis. When the printed circuit board is attached to the stiffener, the conductive spring is concealed and captivated between them.

In another exemplary aspect of the invention, the printed circuit board has a securing means proximate to the grounding pad for securing, without the use of tools, the printed circuit board to the one standoff with which the conductive spring makes contact. The securing means is preferably a keyhole shaped hole in the printed circuit board that has a circular portion and a slotted portion, the slotted portion having a width less than a diameter of the circular portion. The end of the corresponding standoff has a head with a diameter less than the diameter of the circular portion of the keyhole and greater than the width of the slotted portion. When the printed circuit board is lowered onto the standoffs, the head of the one standoff passes through the circular portion of the keyhole. To secure the printed circuit board, it is slid into a position such that the head is over the slotted portion of the keyhole. In this position, the conductive spring presses against and makes contact with the one standoff, thus completing the electrical path from the board ground to the system frame.

In yet another aspect of the invention, the printed circuit board is locked in place in its secured position, preferably by using fasteners in at least two places to fasten the printed circuit board to the plurality of standoffs.

The concealed biaxial card to frame grounding scheme described herein advantageously reduces the time required to fasten and ground the printed circuit board, as well as creating a solution that requires only two locations where space for a tool is a consideration.

BRIEF DESCRIPTION OF THE DRAWINGS

FIG. 3 shows in detail the conductive spring, according to the present invention.

FIG. 4 shows the board assembly mounted to a standoff, according to the present invention.

FIG. 5 shows in detail the head of the standoff in its initial and fastened positions relative to the keyhole cutout in the printed circuit board, according to the present invention.

DETAILED DESCRIPTION OF THE PREFERRED EMBODIMENTS

Figure 1:
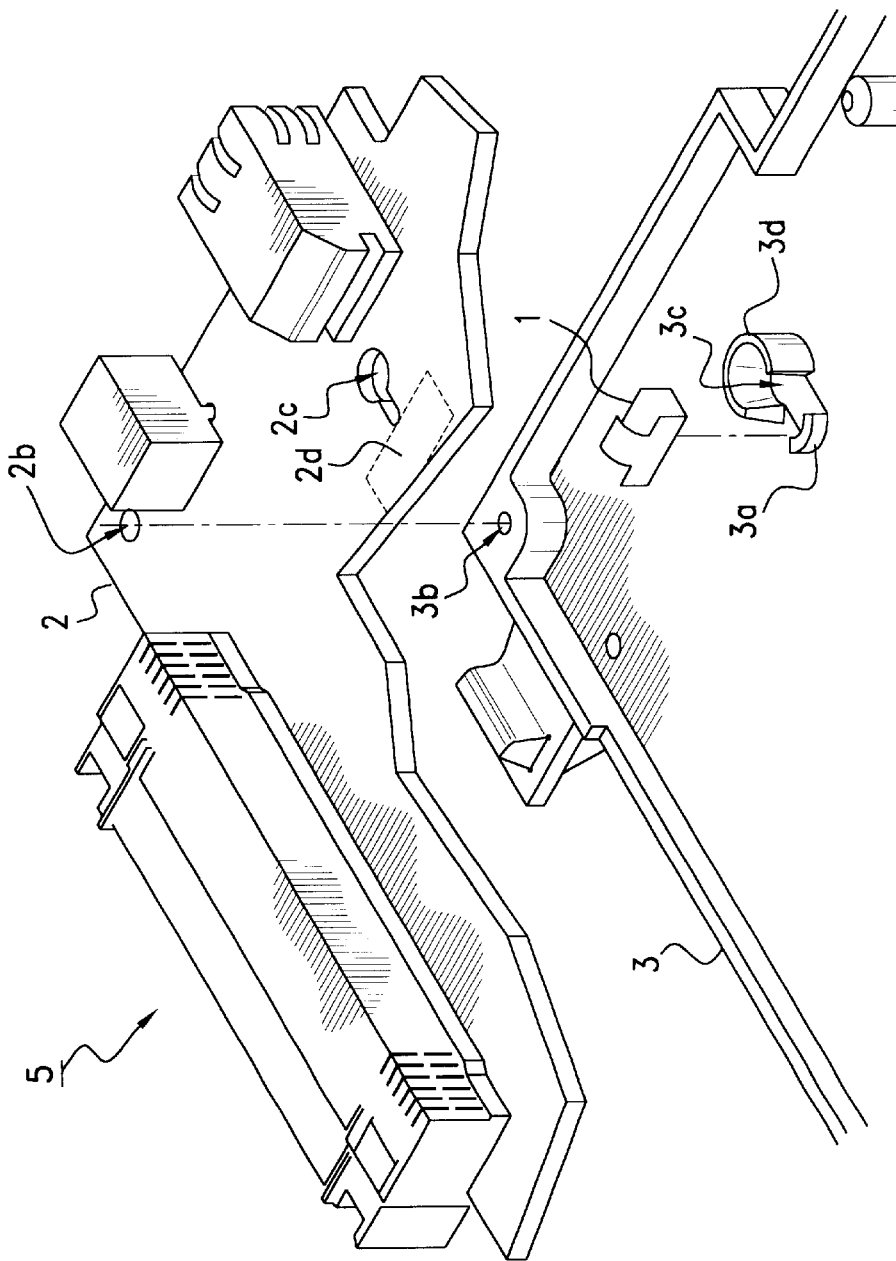
FIG. 1 shows an exploded view of the board assembly, including the printed circuit board, stiffener and conductive spring, according to the present invention.

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed toward a grounding scheme in which one or more concealed biaxially-compressible springs are used to provide electrical contact between grounding pads on a printed circuit board and standoffs used to mount the printed circuit board to the frame of an electronic system. In the embodiment illustrated in FIG. 1, a spring 1 is captivated between a printed circuit board 2, to which electronic components have already been assembled, and a stiffener 3. The stiffener 3, preferably manufactured from a plastic material, is in the general shape of a tray to which the printed circuit board 2 can be fastened. As illustrated in detail in FIG. 2, the spring 1 fits on a boss 3a that is formed as part of the stiffener 3. This attachment method allows the spring 1 to slightly float upon installation, but keeps the spring 1 in place without use of any mechanical fasteners. The spring 1, illustrated in further detail in FIG. 3, is made with a shaped hole 1a that fits over boss 3a to keep the spring in position laterally. The spring 1 is formed so that it is compressible along two orthogonal axes—vertically so as to press against and make contact with the printed circuit board 2, and horizontally so as to press against and make contact with one of the standoffs to which the printed circuit board will be mounted, as discussed in further detail below. The spring 1 is fabricated from flat metal stock. Stainless steel is preferably used for this purpose, but any other suitable conductive material with equivalent mechanical and electrical properties can be substituted.

Figure 2:
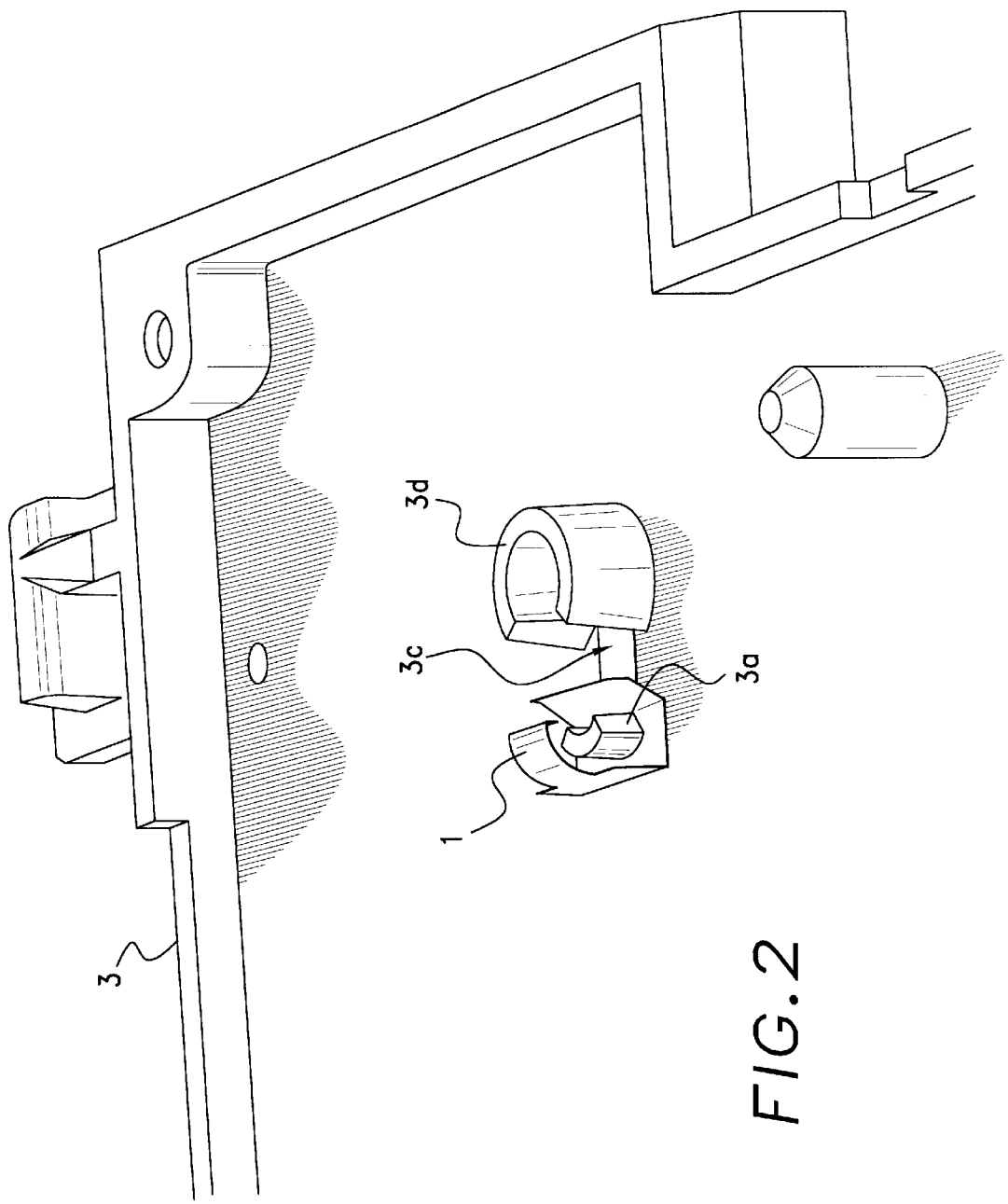
FIG. 2 shows the installation of the conductive spring on the stiffener, according to the present invention.

When assembled, the printed circuit board is secured to the plastic stiffener 3 using screws or other suitable fasteners. As illustrated in FIG. 1, the printed circuit board has holes 2b through which screws (not shown) can be inserted into matching holes 3b in stiffener 3. When the printed circuit board 2 is secured to the plastic stiffener 3, grounding pads 2d on the bottom side of the printed circuit board 2 make contact with the spring 1 providing the first grounding axis. These pads are wired directly to the ground planes of the printed circuit board 2, thus connecting the spring 1 to the board ground.

In the embodiment described in this application, the board assembly 5, comprising the printed circuit board 2, stiffener 3 and spring 1, is mounted to the frame 15 of an electronic system using metal standoffs 10 like the one illustrated in FIG. 4. The stiffener 3 is present but not shown in FIG. 4, in order to more clearly reveal the interaction of the conductive spring 1, printed circuit board 2 and standoff 10. Typically, five standoffs attached to the frame of the system are used to mount each board assembly. The board assembly is mechanically secured to the standoffs without the use of tools by utilizing a keyhole slot technique. As shown in FIG. 1, a "keyhole" shaped cut out 2c is formed in the printed circuit board 2 in a position adjacent to the grounding pad 2d that makes contact with the spring 1. Another keyhole slot 3c is formed in stiffener 3 so as to be aligned with the first keyhole slot 2c when the printed circuit board 2 is fastened to the stiffener 3. The dimensions of the keyhole slot 3c are slightly larger than those of keyhole slot 2c in order to avoid manufacturing tolerance problems. To mount the board assembly 5, the board assembly is lowered onto the standoffs, with the head 10a of each standoff 10 projecting through the large, circular opening in the keyhole slot, as illustrated in FIG. 4. Once the board assembly 5 is resting on the shoulders 10b of the standoffs 10, the board assembly is locked into place by sliding, or moving it laterally, on the standoffs, so that the shank portion 10c of the standoff 10 is positioned in the narrower slot portion of keyhole slot 2c. The shank portion 10c, which is immediately below the head 10a of the standoff 10, has a smaller diameter than the head 10a. When the board assembly 5 is moved from its initial position (Position A) to its fastened position (Position B), as illustrated in FIG. 5, the head 10a of the standoff 10 is over the smaller opening in the slot 2c on the printed circuit board 2, preventing the board assembly 5 from moving in the vertical direction. A spacer 3d, formed around the keyhole opening 3c on the plastic stiffener 3, prevents the downward deflection of the printed circuit board 2 when the board assembly 5 is in Position B. When the board assembly 5 is in the fastened position (Position B), the spring 1 is compressed against and contacts the standoff 10, which carries the circuit board ground to the frame ground of the electronic system, providing the second grounding axis. This biaxial interaction of the spring 1 with the printed circuit board 2 and the standoff 10 is shown in FIG. 4.

To prevent the board assembly 5 from for moving relative to the standoffs 10 and breaking free, the board assembly is typically screwed into the frame of the electronic apparatus in two locations. This is preferably accomplished by making two of the standoffs with tapped holes in their upper ends and using screws, for example, to secure the board assembly to these standoffs instead of using the keyhole slot arrangement described above. The standoffs chosen for securing the board assembly with screws are in positions readily accessible to tools.

As illustrated in FIG. 4, a second printed circuit board 20 may be mounted on the bottom of the plastic stiffener (not shown for clarity) to increase the overall packaging density of the electronic system of which the board assembly forms a part. The second printed circuit board 20 also has an elongated opening (not shown) that aligns with the keyhole opening in the stiffener (not shown in FIG. 4). When the board assembly 5 is in its fastened position on the standoff 10, the back of the second printed circuit board 20 rests on the shoulder 10b of the standoff. Grounding of the second printed circuit board 20 can be accomplished with a grounding pad formed around the opening on the bottom surface of the second printed circuit board, so as to be directly in contact with the shoulder 10b of standoff 10.

In summary, the method described herein for grounding a printed circuit board to a plurality of standoffs attached to the frame of an electronic system involves securing the printed circuit board to at least one of the plurality of standoffs using a securing means that does not require the use of tools, and positioning a conductive spring, compressible in two axes, such that it makes electrical contact with both the one standoff and a grounding pad formed on the printed circuit board. Preferably, the biaxially-compressible conductive spring is captivated between the printed circuit board and a plastic stiffener to which the board is fastened. In the preferred embodiment, the securing means is a keyhole-shaped hole in the printed circuit board having a circular portion through which the head of the one standoff can pass, but which secures the board when the board is slid into a position such that the head is over the slotted portion of the keyhole. When the board is fully installed in its secured position in the electronic system, the one standoff makes contact with the conductive spring, completing the ground path.

It should be understood that the invention is not necessarily limited to the specific process, arrangement, materials and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A board assembly mountable to a plurality of standoffs attached to a system frame, comprising:
   a printed circuit board having a grounding pad formed on one side and a securing means proximate to the grounding pad for securing the printed circuit to one of the plurality of standoffs without the use of tools; and
   a conductive spring compressible along two essentially perpendicular axes that makes electrical contact with both the grounding pad and the one standoff when the printed circuit board is mounted on and secured to the one standoff.

2. The board assembly according to claim 1, wherein the securing means is a keyhole-shaped hole in the printed circuit board, having a circular portion and a slotted portion, the slotted portion having a width less than a diameter of the circular portion.

3. The board assembly according to claim 2, wherein the one standoff has a head with a diameter less than the diameter of the circular portion of the keyhole and greater than the width of the slotted portion, and wherein the board assembly is secured to the one standoff by passing the head of the one standoff through the circular portion of the keyhole and then sliding the printed circuit board into a secured position such that the head is over the slotted portion.

4. The board assembly according to claim 3, wherein the conductive spring makes electrical contact with the one standoff when the printed circuit board is in its secured position.

5. The board assembly according to claim 3, further comprising:
   means for locking in place the printed circuit board when it is in its secured position.

6. The board assembly according to claim 5, wherein the means for locking includes fasteners in at least two places to fasten the printed circuit board to the plurality of standoffs.

7. A board assembly mountable to a plurality of standoffs attached to a system frame, comprising:
   a printed circuit board having a grounding pad formed on one side and a securing means proximate to the grounding pad for securing the printed circuit to one of the plurality of standoffs without the use of tools;
   a conductive spring compressible along two axes that makes electrical contact with both the grounding pad and the one standoff when the printed circuit board is mounted on and secured to the one standoff; and
   a stiffener to which the printed circuit board is attached, the stiffener having a retaining means for retaining the conductive spring in position.

8. The board assembly according to claim 7, wherein the conductive spring is captivated between the printed circuit board and the stiffener when the printed circuit board is attached to the stiffener.

9. The board assembly according to claim 1, wherein the stiffener is comprised of a plastic material.

10. The board assembly according to claim 1, wherein the retaining means is a boss formed on the stiffener, and the conductive spring includes a hole that fits over the boss.

11. The board assembly according to claim 10, wherein the conductive spring has a first portion that is adapted to exert a first spring force in a first direction along one of the axes, and a second portion that is adapted to exert a second spring force in a second direction along another one of the axes, the hole being between the first portion and the second portion.

12. The board assembly according to claim 11, wherein the first direction is essentially perpendicular to the second direction.

13. The board assembly according to claim 11, wherein the first spring force and the second spring force are each separately exertable.

14. A method of grounding a printed circuit board through a plurality of standoffs attached to a system frame, comprising:
   securing the printed circuit board to one of the plurality of standoffs using a securing device that does not require the use of tools; and
   positioning a conductive spring, compressible in two essentially perpendicular axes, such that it makes electrical contact with both the one standoff and a grounding pad formed on one side of the printed circuit board in proximity to the securing device for the one standoff.

15. The method according to claim 14, wherein the securing device is a keyhole-shaped hole in the printed circuit board, having a circular portion and a slotted portion, the slotted portion having a width less than a diameter of the circular portion.

16. The method according to claim 15, wherein the one standoff has a head with a diameter less than the diameter of the circular portion of the keyhole and greater than the width of the slotted portion, and wherein the board assembly is secured to the one standoff by passing the head of the one standoff through the circular portion of the keyhole and then sliding the printed circuit board into a secured position such that the head is over the slotted portion.

17. The method according to claim 16, wherein the conductive spring makes electrical contact with the one standoff when the printed circuit board is in its secured position.

18. The method according to claim 16, further comprising:
   locking in place the printed circuit board when it is in its secured position, by means of fasteners in at least two places to fasten the printed circuit board to the plurality of standoffs.

19. A method of grounding a printed circuit board through a plurality of standoffs attached to a system frame, comprising:
   securing the printed circuit board to one of the plurality of standoffs using a securing device that does not require the use of tools;
   positioning a conductive spring, compressible in two axes, such that it makes electrical contact with both the one standoff and a grounding pad formed on one side of the printed circuit board in proximity to the securing device for the one standoff; and
   attaching the printed circuit board to a stiffener, the stiffener having a retaining device for retaining the conductive spring in position.

20. The method according to claim 19, wherein the stiffener is comprised of a plastic material.

21. The method according to claim 19, wherein the retaining device is a boss formed on the stiffener, and the conductive spring includes a hole that fits over the boss.

22. The method according to claim 19, wherein the conductive spring is captivated between the printed circuit board and the stiffener when the printed circuit board is attached to the stiffener.

23. A system having a concealed biaxial card to frame grounding scheme, comprising:
- a system frame;
- a plurality of conductive standoffs attached, and conductively coupled, to the system frame; and
- a card assembly mountable to the plurality of standoffs that includes:
  - a printed circuit board having a grounding pad formed on one side and a keyhole-shaped hole proximate to the grounding pad for securing the printed circuit board to one of the plurality of standoffs without the use of tools;
  - a conductive spring compressible along two axes that makes electrical contact with both the grounding pad and the one standoff when the printed circuit board is mounted on and secured to the plurality of standoffs; and
  - a plastic stiffener to which the printed circuit board is attached prior to being mounted on the plurality of standoffs;

wherein the conductive spring is captivated between the printed circuit board and the stiffener when the printed circuit board is attached to the stiffener, wherein the keyhole-shaped hole in the printed circuit board has a circular portion and a slotted portion, the slotted portion having a width less than a diameter of the circular portion, wherein the one standoff has a head with a diameter less than the diameter of the circular portion of the keyhole and greater than the width of the slotted portion, and wherein the board assembly is secured to the one standoff by passing the head of the one standoff through the circular portion of the keyhole and then sliding the printed circuit board into a position such that the head is over the slotted portion.

* * * * *